(12) United States Patent
Erickson et al.

(10) Patent No.: US 6,725,099 B2
(45) Date of Patent: *Apr. 20, 2004

(54) RAMP RATE LIMITER TO CONTROL STRESS DURING RAMPING

(75) Inventors: Mark Erickson, Sunnyvale, CA (US); Thorkell Gudmundsson, San Jose, CA (US); Sunil C. Shah, Los Altos, CA (US)

(73) Assignee: Tokyo Electron Limited, Tokyo (JP)

( * ) Notice: Subject to any disclaimer, the term of this patent is extended or adjusted under 35 U.S.C. 154(b) by 264 days.

This patent is subject to a terminal disclaimer.

(21) Appl. No.: 09/894,061

(22) Filed: Jun. 27, 2001

(65) Prior Publication Data

US 2001/0036612 A1 Nov. 1, 2001

Related U.S. Application Data

(62) Division of application No. 09/345,431, filed on Jul. 1, 1999, now Pat. No. 6,294,394.

(51) Int. Cl.[7] .............................................. G05B 13/02
(52) U.S. Cl. ............................ 700/33; 700/44; 700/45; 700/121; 700/300; 118/725; 219/391; 392/416; 392/418; 432/36; 438/5; 438/14
(58) Field of Search ......................... 700/33, 44, 45, 700/300, 121; 118/725; 219/391; 392/416, 418; 432/36; 438/5, 14

(56) References Cited

U.S. PATENT DOCUMENTS

| 3,898,439 | A |   | 8/1975  | Reed et al. |
| 4,445,180 | A |   | 4/1984  | Davis et al. |
| 4,625,510 | A | * | 12/1986 | Evans ........................ 60/792 |
| 5,359,693 | A | * | 10/1994 | Nenyei et al. ............. 392/418 |
| 5,778,339 | A |   | 7/1998  | Sonohara et al. |
| 5,820,366 | A | * | 10/1998 | Lee ............................ 432/241 |
| 5,951,896 | A | * | 9/1999  | Mahawili .................... 219/411 |
| 6,023,555 | A | * | 2/2000  | Penelon et al. ............ 392/416 |
| 6,114,670 | A | * | 9/2000  | Erickson et al. ............ 219/497 |

* cited by examiner

Primary Examiner—Ramesh Patel
Assistant Examiner—Douglas Shute
(74) Attorney, Agent, or Firm—Blakely, Sokoloff, Taylor & Zafman LLP

(57) ABSTRACT

The present invention includes a method and system for limiting the ramp rate of a variable under control in order to control stress in a process or plant under control. The present invention takes a limit curve provided by the user and combines that limit curve with a scale factor curve obtained from a model of the system to produce an allowable limit curve. A ramp rate limiter then uses the allowable limit curve to control the ramp rate of the variable under control such that the ramp rate of the variable under control is able to achieve the maximum allowable limit but no more.

22 Claims, 8 Drawing Sheets

RAMP RATE LIMITER TO CONTROL STRESS DURING RAMPING

This application is a divisional of application Ser. No. 09/345,431, filed on Jul. 1, 1999, entitled RAMP RATE LIMITER TO CONTROL STRESS DURING RAMPING now U.S. Pat. No. 6,294,394.

BACKGROUND OF THE INVENTION

1. Field of the Invention

This invention relates to the control of processes and plants that perform those processes. More specifically, the present invention relates to the limiting of the ramp rate of variable under control in order to control stress in a process or plant.

2. Background Information

In control of a plant or process a control system attempts to ramp up and stabilize to a particular variable under control. In some processes or plants (i.e., systems under control) the ramping process may cause stresses which affect the overall yield of the system. The following description describes an example of a problem where the temperature ramping process in a semiconductor furnace may cause stress on a wafer. It should be noted, however, that such problems may occur in other systems and that the example is meant merely to be illustrative and not limiting.

FIG. 1 illustrates a graph of the temperatures on a wafer surface in a semiconductor furnace. Line 110 illustrates the setpoint programmed by the user for the desired temperature on a wafer in a semiconductor furnace. Line 120 illustrates the temperature at the center of the wafer and line 130 illustrates the temperature at the edge of the wafer.

FIG. 2 illustrates a graph of the difference between the temperatures at the edge of the wafer and at the center of the wafer for FIG. 1. Line 210 represents the result of the edge temperature of the wafer minus the center temperature of the wafer (i.e., edge-center temperature).

FIG. 3 illustrates a graph of the difference between the temperatures at the edge of the wafer and at the center of the wafer plotted as (edge-center) temperature versus wafer temperature. Line 310 illustrates the edge temperature of the wafer minus the center temperature of the wafer (i.e., edge-center). As shown, as the (edge-center) 310 ramps up it stabilizes quickly at a quasi-steady state value and then as the ramp rate slows down (i.e., the ramp rate decreases and the temperature of the furnace/wafer stabilizes as illustrated in FIG. 1) the (edge-center) 310 drops off.

Also illustrated in FIG. 3 is stress limit curve 320. The (edge-center) difference may put physical stress on the wafer. Too much stress on the wafer may cause slip faults in the crystals of the wafer. Slip faults are cracks in the crystal structure of a wafer. Slip faults can damage the semiconductor devices being manufactured on the wafer, thus reducing the number of working devices on the wafer (i.e., reducing the yield of the entire semiconductor factory).

The stress limit curve 320 describes an allowable limit. If, at a particular wafer temperature, the (edge-center) temperature 310 is below the stress limit curve 320, slip faults will rarely occur. However, if at any wafer temperature the (edge-center) temperature 310 exceeds the stress limit curve 320, slip faults are much more likely to occur. Therefore, it is desirable to keep the edge-center difference 310 below the stress limit curve 320.

One current attempt to keep the edge-center difference of the wafer temperature below the stress limit curve is to manually adjust the ramp rate. Manual adjustments are mainly made because it is hard to determine the temperatures at the center and edges of the wafer. In general the temperatures at these areas must be estimated because it is difficult to place an actual measurement device close enough to the center of the wafer or the edge of the wafer to measure the actual temperature of those areas.

What is needed is a method and system to limit the ramp rate of a variable under control in order to control stress in a process or plant under control.

SUMMARY OF THE INVENTION

The present invention includes a method and system for limiting the ramp rate of a variable under control in order to control stress in a process or plant under control. The present invention takes a limit curve provided by the user and combines that limit curve with a scale factor curve obtained from a model of the system to produce an allowable limit curve. A ramp rate limiter then uses the allowable limit curve to control the ramp rate of the variable under control such that the ramp rate of the variable under control is able to achieve the maximum allowable limit but no more.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method and system for a ramp rate limiter to control stress during ramping are disclosed. In the following description, numerous specific details are set forth such as specific equipment, processes, parameters, etc. in order to provide a thorough understanding of the present invention. It will be apparent, however, to one skilled in the art that these specific details need not be employed to practice the present invention. In other instances, well known materials or methods have not been described in detail in order to avoid unnecessarily obscuring the present invention.

The present invention includes a method and system for limiting the ramp rate of a variable under control in order to minimize stress in a process and/or plant under control. The present invention takes a limit curve provided by the user and combines that limit curve with a scale factor curve obtained from a model of the system to produce an allowable ramp rate curve. A ramp rate limiter then uses the allowable ramp rate curve to limit the ramp rate of the variable under control such that the ramp rate of the variable under control is able to change by the maximum allowable limit but no more.

It should be noted that although the following description describes ramp rates in terms of temperature on a semiconductor wafer and stress related to a temperature difference on the wafer, the present invention may apply to other ramp rates for example ramp rates with regard to velocity, pressure, gas flow, positioning, etc.

It should also be noted that the stress may be related to a physical value with units different from the units associated with the variable under control. For example, the variable under control may be a velocity and the stress may be associated with a force. In such an example, the velocity ramp rate would be limited in order to control the force associated with stress in the process or plant under control.

Figure 1:
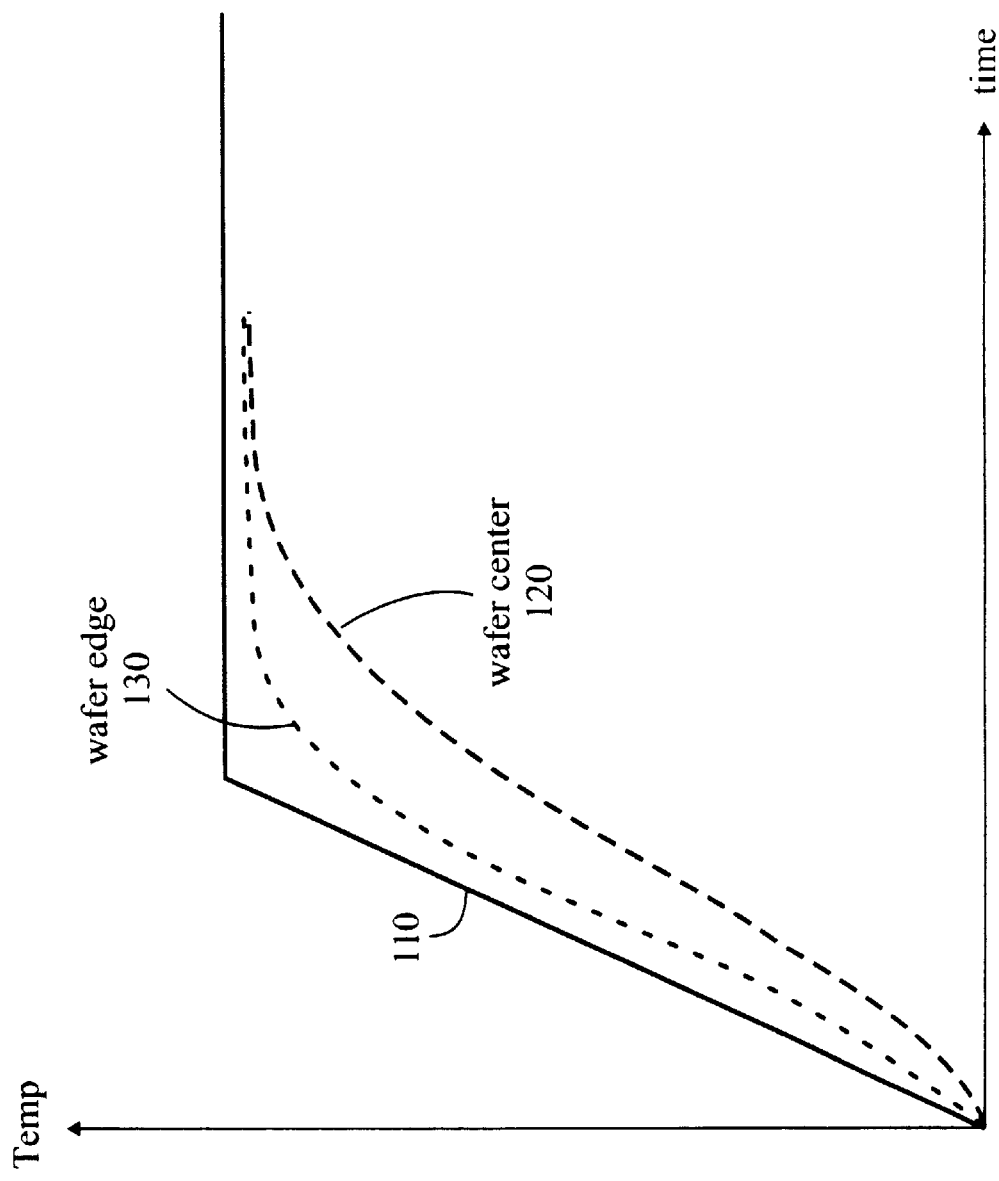
FIG. 1 illustrates a graph of the temperatures on a wafer surface in a semiconductor furnace.
Figure 2:
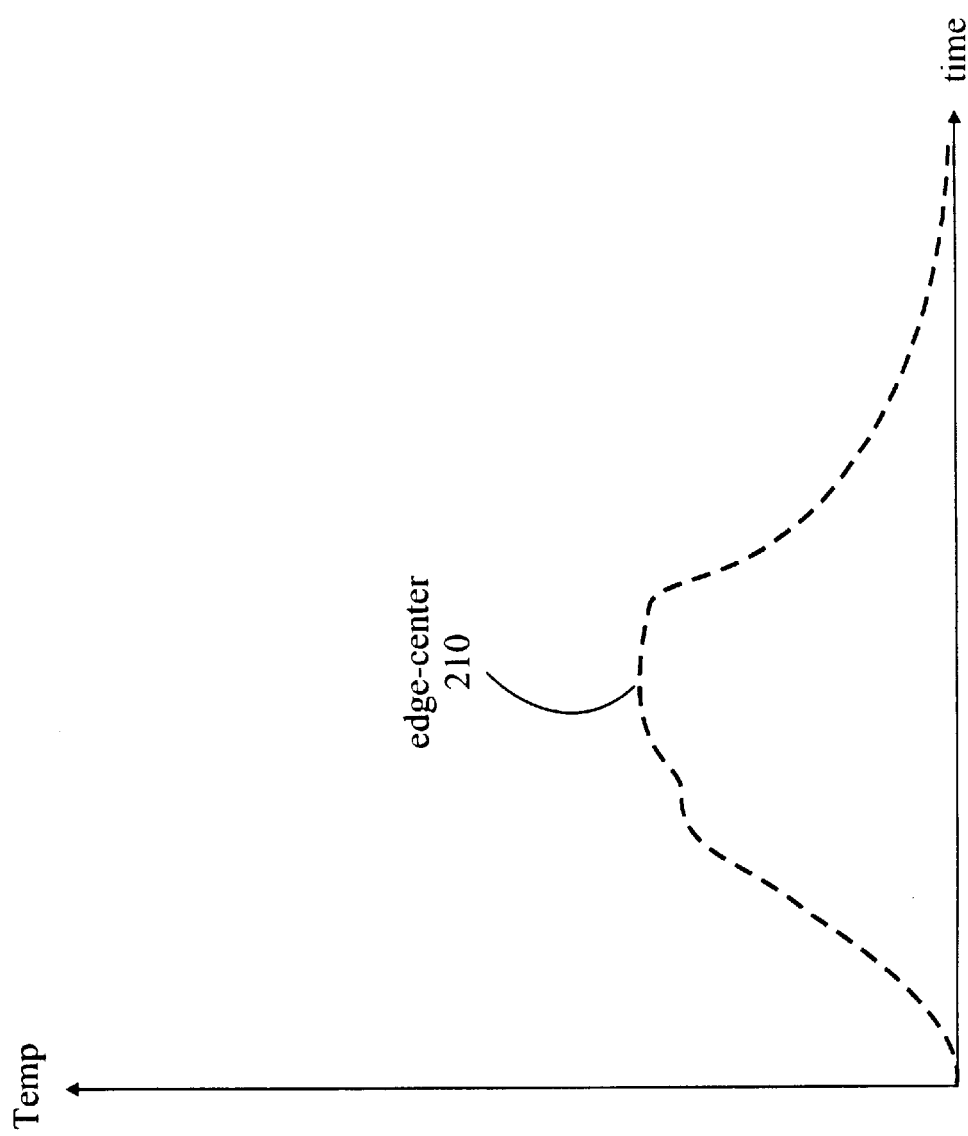
FIG. 2 illustrates a graph of the difference between the temperatures at the edge of the wafer and at the center of the wafer.
Figure 3:
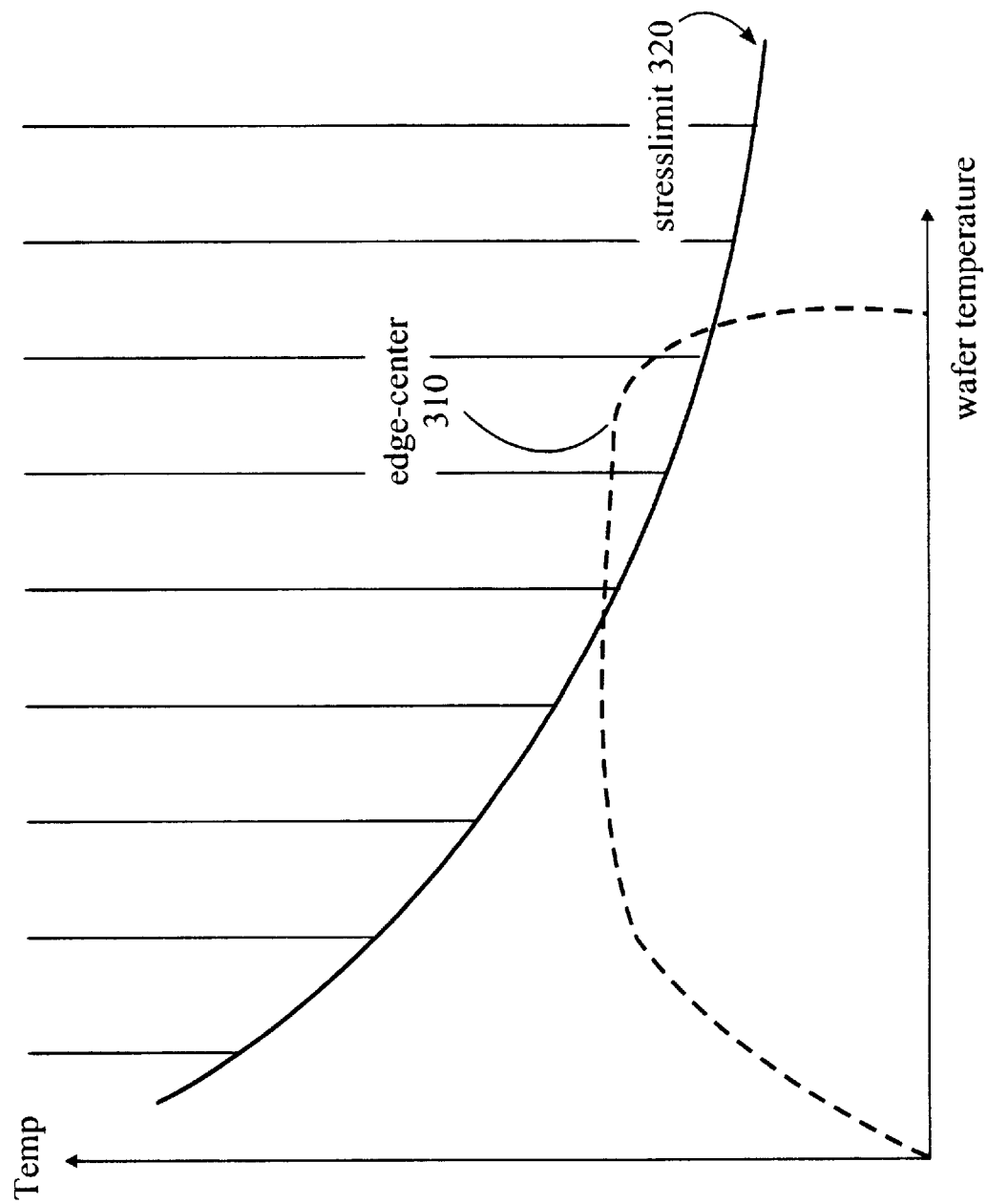
FIG. 3 illustrates a graph of the difference between the temperatures at the edge of the wafer and at the center of the wafer plotted as (edge-center) temperature versus wafer temperature.
Figure 4:
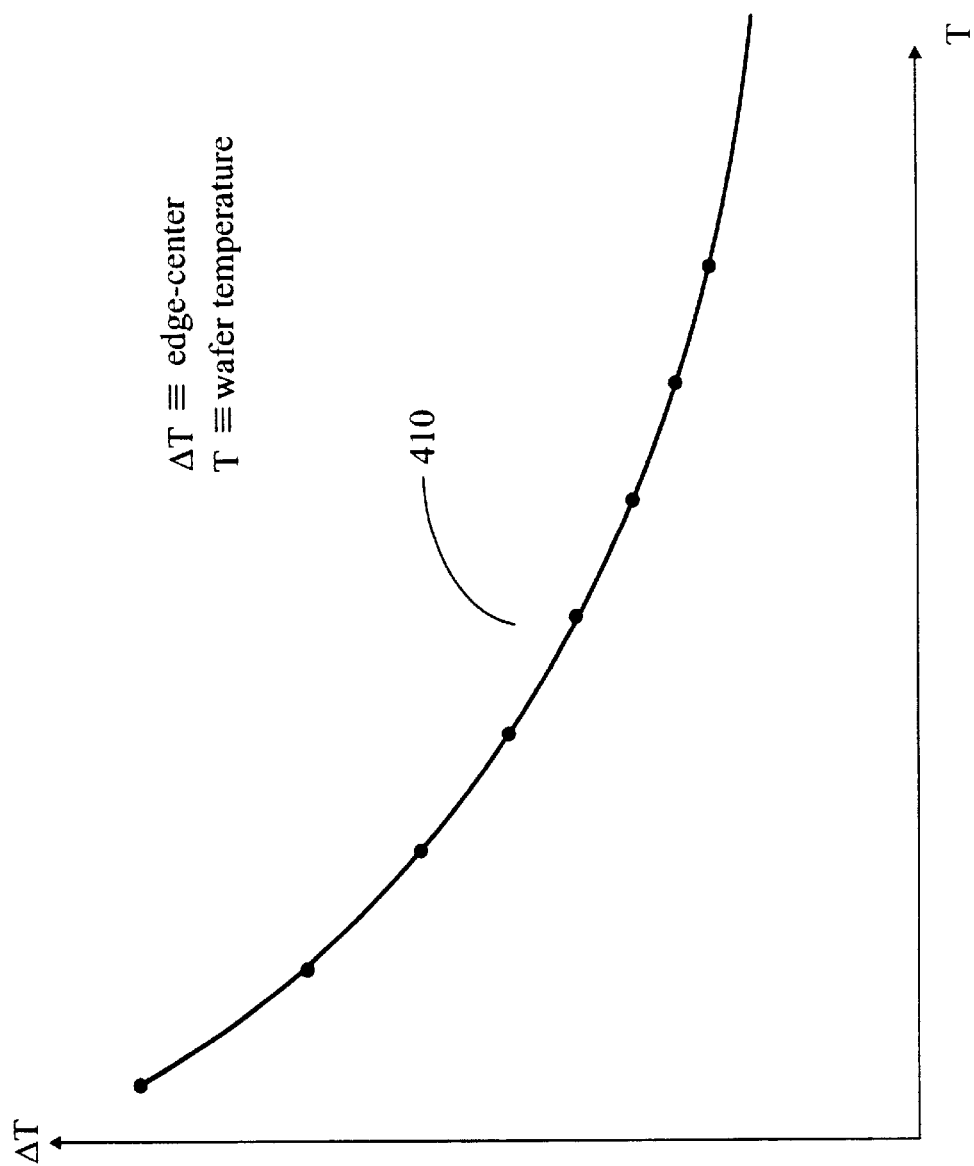
FIG. 4 illustrates a graph of the (edge-center) difference versus the wafer temperature.

FIG. 4 illustrates a graph of the edge-center difference versus the wafer temperature. As illustrated in FIG. 4, the edge-center difference is represented as $\Delta T$ and the wafer temperature is represented as T. Plotting $\Delta T$ versus T creates limit curve 410 for the particular plant under control, for example a semiconductor furnace used to process semiconductor wafers. This limit curve is entered by the user.

In one embodiment of the present invention the user enters a number of (Temp, $\Delta T$) pairs which, when interpolated, form the curve 410. It should be noted that the user may enter the curve in other ways, for example, using a graphical software tool. It should also be noted that the user enters a limit curve for the particular process being performed and that different processes may have different limit curves.

It is well known in the field of semiconductor manufacturing that wafer stress is directly related to the wafer edge-center temperature difference. Because of this fact, limiting the wafer edge-center temperature difference will have the effect of limiting the wafer stress.

Figure 5:
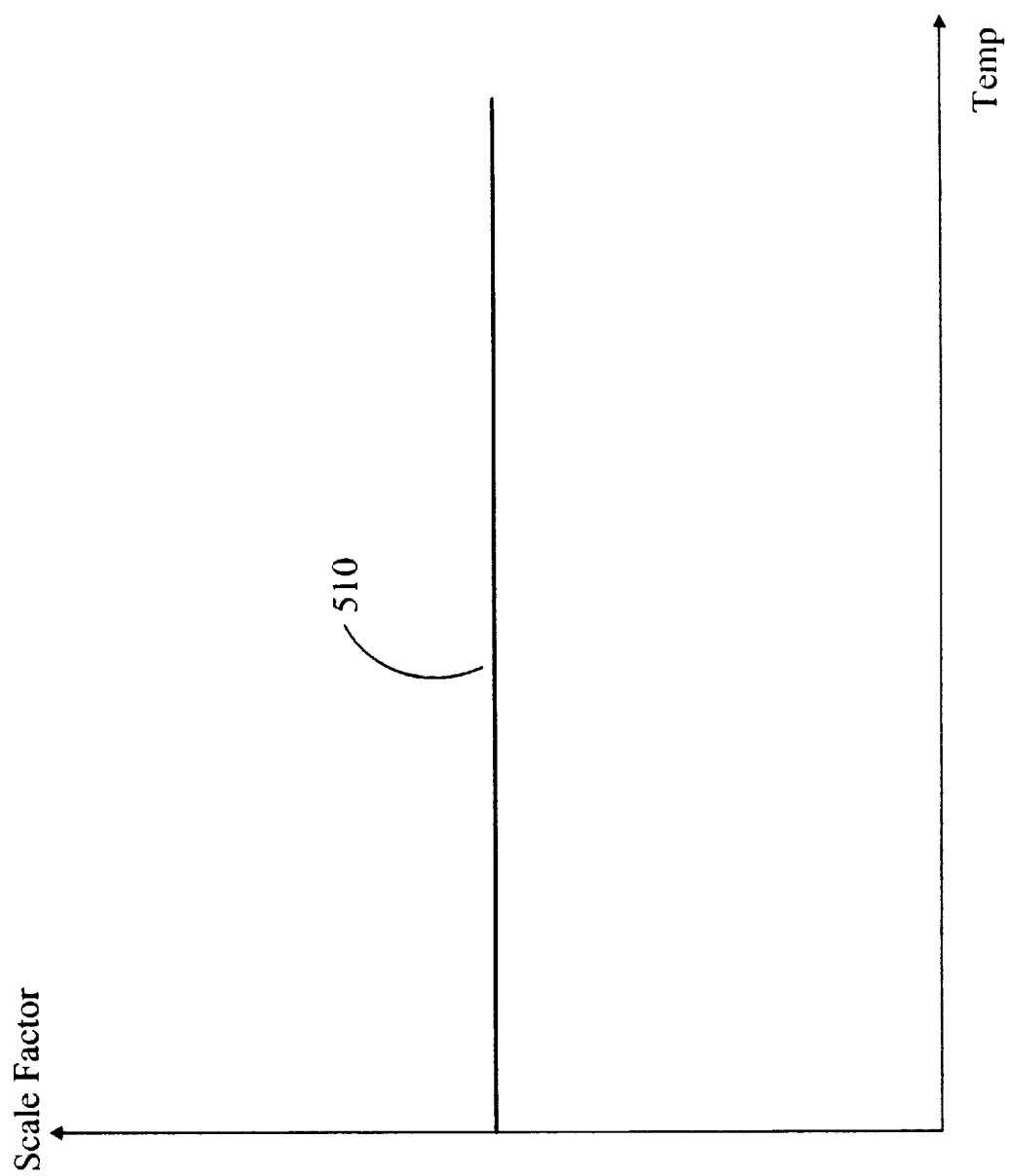
FIG. 5 illustrates a graph of scale factor versus wafer temperature.

FIG. 5 illustrates a graph of scale factor versus wafer temperature. The scale factor relates the actual wafer ramp rate and the edge-center difference. There exists a quasi-steady state approximation such that if the actual ramp rate of the wafer is known and if the scale factor is known, then an approximation of the edge-center difference ($\Delta T$) may be computed. In other words, at each temperature T, the ramp rate multiplied by the scale factor approximately equals the edge-center difference (i.e., ramprate·scalefactor≅$\Delta T$). As illustrated in FIG. 5, scale factor curve 510 may be constant. The scale factor may also vary with temperature. The scale factor curve 510 may be obtained from a mathematical model of the system.

Figure 6:
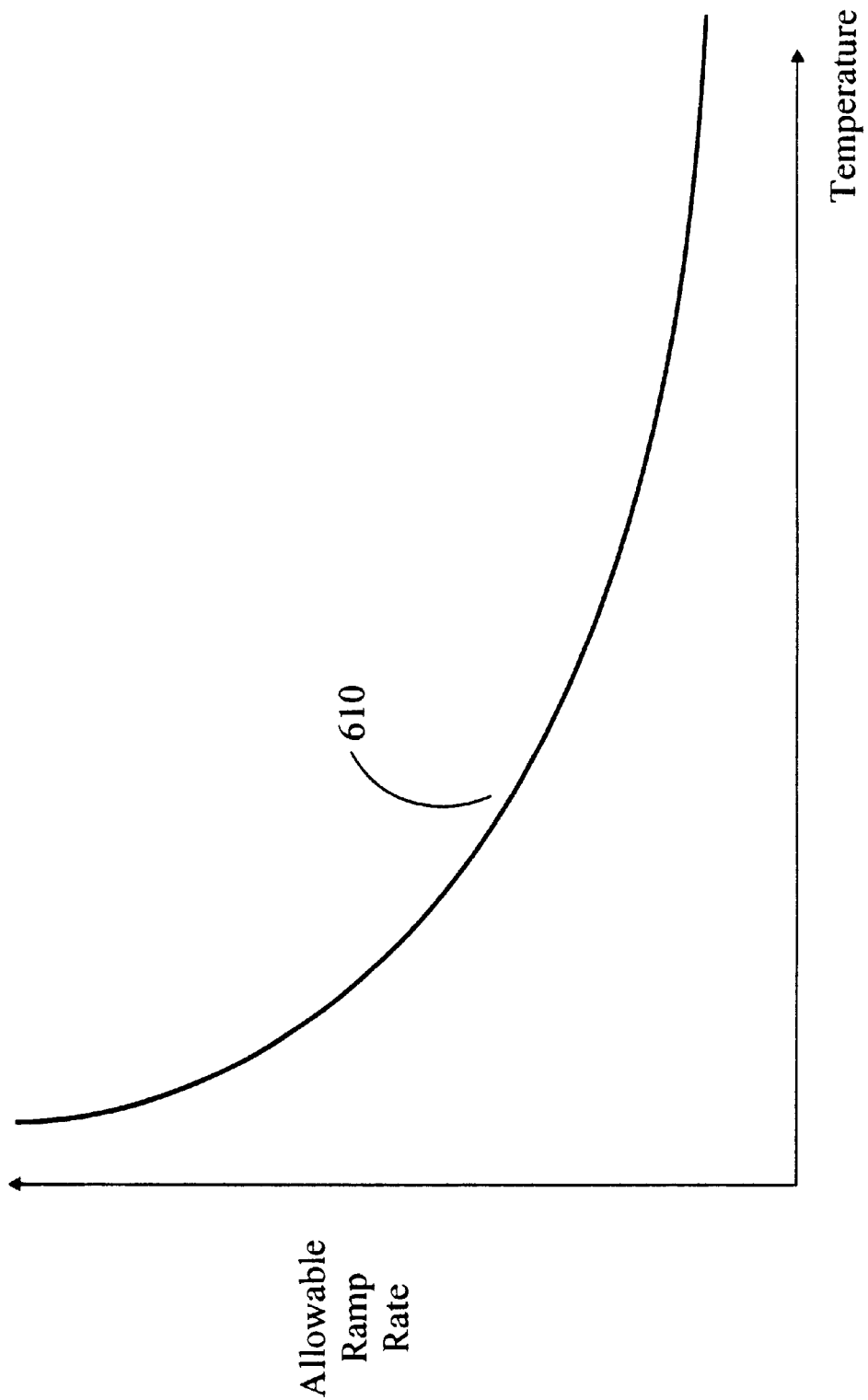
FIG. 6 illustrates a graph of allowable ramp rate versus wafer temperature.

The user entered curve 410 is then combined with the scale factor curve 510 to create limit curve 610 that represents the allowable ramp rate versus temperature, as illustrated in FIG. 6. Limit curve 610 represents the maximum allowable ramp rate for the system.

One embodiment of the present invention takes the temperature setpoint programmed by the user, $r_{requested}(t)$, and produces a setpoint, $r_{out}(t)$, that does not exceed the allowable limit curve 610. The embodiment operates at a fixed time interval. For the purpose of this description, the time interval is 1. At each time point the embodiment compares the current setpoint that the user is requesting $r_{requested}(t)$ to the previous output setpoint $r_{out}(t-1)$. The embodiment then determines whether setting $r_{out}(t)$ to be $r_{requested}(t)$ will cause the ramp rate to exceed the allowable limit curve 610. To do this, the embodiment computes the difference $[r_{requested}(t)-r_{out}(t-1)]$. The embodiment also computes a maximum allowable temperature difference $r_{limit}(t)$ by evaluating the allowable limit curve 610 at temperature $r_{out}(t-1)$. If the difference $[r_{requested}(t)-r_{out}(t-1)]$ is less than $r_{limit}(t)$, setting $r_{out}(t)$ equal to $r_{requested}(t)$ will not exceed the allowable limit $r_{limit}(t)$. The embodiment then sets $r_{out}(t)$ equal to $r_{requested}(t)$. If, however, the difference $[r_{requested}(t)-r_{out}(t-1)]$ is greater than the allowable limit $r_{limit}(t)$, setting $r_{out}(t)$ equal to $r_{requested}(t)$ will exceed the allowable limit $r_{limit}(t)$. To avoid this, the embodiment sets $r_{out}(t)$ equal to the previous output $r_{out}(t-1)$ plus the allowable difference $r_{limit}(t)$.

It should be noted that the above described embodiment illustrates a case where a positive ramp rate is requested (i.e., $r_{requested}(t)$ is increasing) and must be limited. It should also be noted that the present invention may be applied in cases where a negative ramp rate is requested (i.e., $r_{requested}(t)$ is decreasing) and must be limited.

Figure 7:
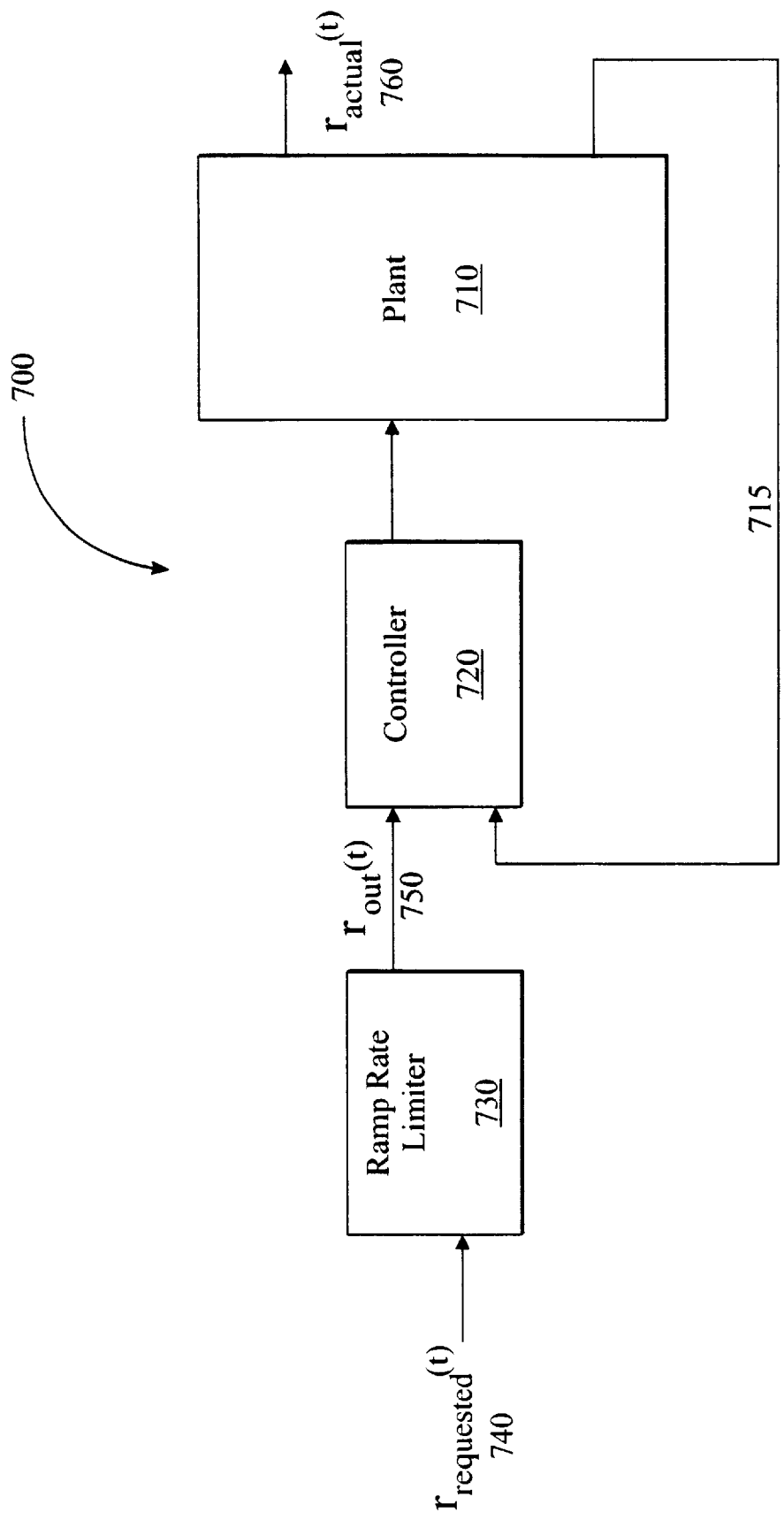
FIG. 7 illustrates a block diagram of system according to one embodiment of the present invention.

FIG. 7 illustrates a block diagram of a system according to one embodiment of the present invention. As illustrated in FIG. 7, the system 700 includes a device under control (or plant) 710, controller 720, and ramp rate limiter (limiter) 730. The requested setpoint, $r_{requested}(t)$ 740, is input into the limiter 730. Limiter 730 produces a limiter value, $r_{out}(t)$ 750, and inputs $r_{out}(t)$ 750 into controller 720. The controller 720 and plant 710 together produce $r_{actual}(t)$ 760 which is the actual value of the variable under control that is realized in the plant 710.

Figure 8:
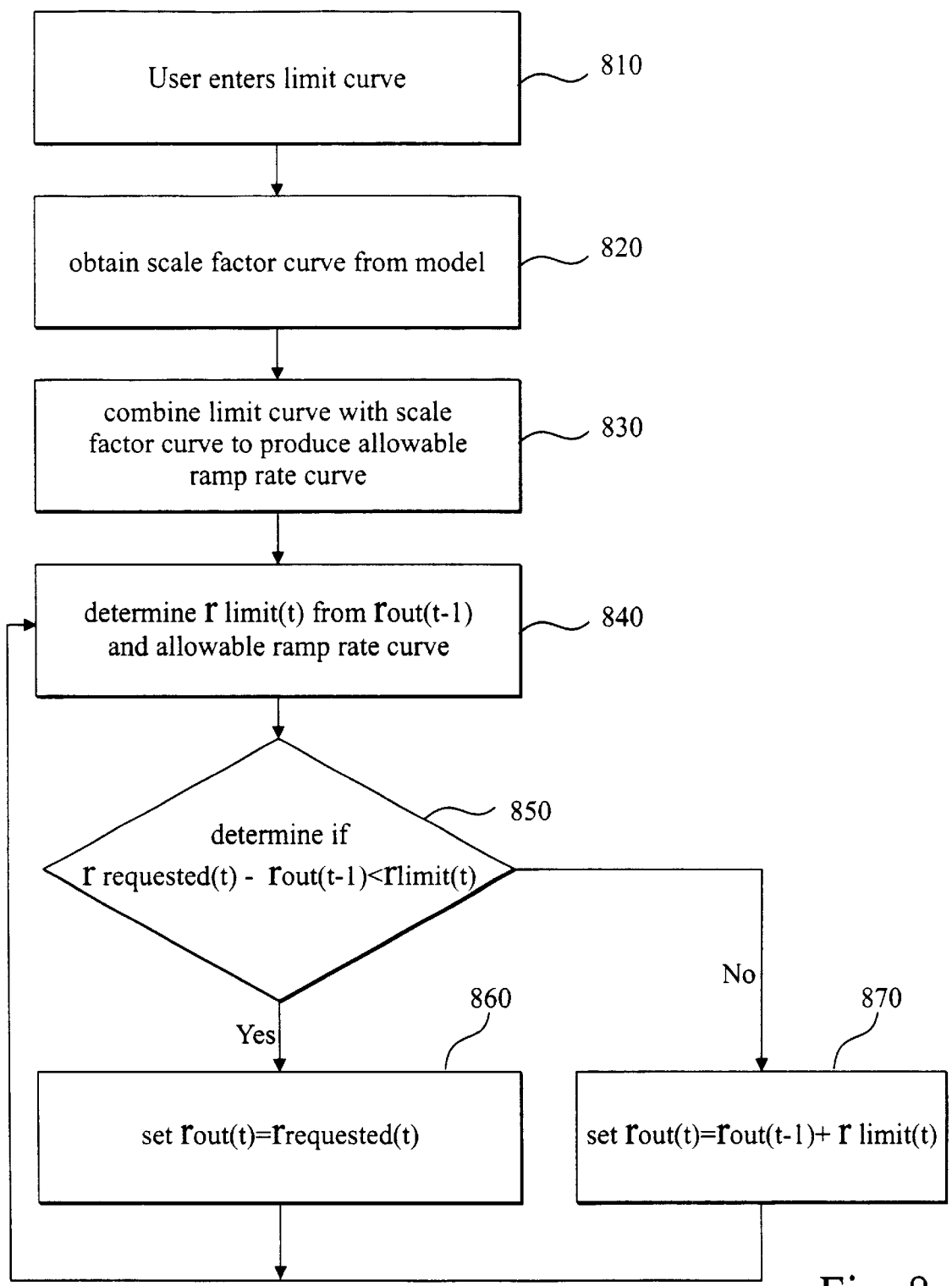
FIG. 8 illustrates a flow chart of one embodiment of the present invention.

FIG. 8 illustrates a flow chart of one embodiment of the present invention. It should be noted that the flow chart of FIG. 8 is merely meant to be demonstrative and that the steps included in the flow chart may follow many other orders and not just the order illustrated.

At step 810, the user enters a limit curve 410 mapping $\Delta T$ versus T. The user determines this limit curve as described above with regard to FIG. 4.

At step 820, a scale factor curve 510 is obtained. The scale factor curve 510 is obtained from a model that is associated with the system 700 as is described above with regard to FIG. 5.

At step 830, the maximum allowable ramp rate limit curve 610 is produced. Limit curve 610 is produced from the combination of the user limit curve 410 and the scale factor curve 510 as described above with regard to FIG. 6. At step 840, an allowable limit $r_{limit}(t)$ is computed by evaluating the allowable limit curve 610 at temperature $r_{out}(t-1)$.

At step 850, it is determined if the difference between the current setpoint requested by the user $r_{requested}(t)$ and the previous setpoint produced by the limiter $r_{out}(t-1)$ is greater than the allowable limit $r_{limit}(t)$ (i.e., if $[r_{quested}(t)-r_{out}(t-1)] > r_{limit}(t)$). If the difference $[r_{requested}(t)-r_{out}(t-1)]$ is less than $r_{limit}(t)$, the limiter sets the output value $r_{out}(t)$ equal to $r_{requested}(t)$ at step 860. If the difference $[r_{requested}(t)-r_{out}(t-1)]$ is not less than $r_{limit}(t)$, the limiter sets the output value $r_{out}(t)$ equal to $r_{out}(t)+r_{limit}(t)$ at step 870.

In one embodiment of the present invention steps 830, 840, 850, and 860 or 870 are performed on an ongoing basis at each time point during the operation of the system. In the embodiment described above, the time interval between time points is 1, however other embodiments may operate at time intervals different from 1. In addition, the time interval between time points need not be the same for all time points.

It should be noted that the comparisons may be made as "less than", "greater than", "less than or equal to", "greater than or equal to", etc. and that the embodiment described above is meant merely to be exemplary and not limiting. It should also be noted that the comparison given above is just one example of a comparison that may be made to determine which value to select for $r_{out}(t)$. For example, if the time intervals are different from 1, a different comparison would be used in step 850.

Additionally, it should be noted that although the example given in the above description discusses the ramp rate as being the temperature ramp rate of a semiconductor furnace, the ramp rate may be for many other variables under control such as the ramp rate of flow (for example in a semiconductor deposition chamber), the ramp rate of velocity (for example of a car), etc.

Further, it should also be noted that the stress may be related to a physical value with units different from the units associated with the variable under control. For example, the variable under control may be a velocity and the stress may be associated with a force. In such an example, the velocity ramp rate would be limited in order to control the force associated with stress in the process or plant under control.

Still further, it should be noted that although the above description discusses the present invention in terms of the setpoint of a single variable under control, the present invention may be used in systems with setpoints for multiple variables under control. In the multivariable case, a separate curve (shown in FIGS. 4, 5, and 6) is determined for each variable under control. A separate ramp rate limiter 730 is implemented for each setpoint. Each individual ramp rate limiter may operate independently. The ramp rate limiters may also be linked together. For example, if one limiter sets its $r_{out}(t)=r_{out}(t-1)+r_{limit}(t)$, the other limiters may also set their outputs $r_{out}(t)$ in a similar fashion.

Yet further, the embodiment described above may be modified to yield other embodiments of the invention that limit ramp rates to control stress. For example, step 840 of FIG. 8 may be modified so that $r_{limit}(t)$ is determined from the value of $r_{actual}(t)$ and the allowable ramp rate curve. In another example, step 840 may be modified so that $r_{limit}(t)$ is determined from an estimate of $r_{actual}(t)$ and the allowable ramp rate curve. In yet another example, the controller 720 of FIG. 7 might take a ramp rate rather than a setpoint as input. In such an example, the ramp rate limiter 730 would use the user-entered limit curve and the scale factor curve to directly limit the ramp rate input to the controller.

Thus, a method and system for a ramp rate limiter to control stress during ramping have been described. Although specific embodiments, including specific equipment, processes, and parameters have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A system for controlling stress during ramping of a variable under control comprising:
   a limiter;
   at least one controller, wherein the limiter provides a limiter value to the at least one controller that adjusts a semiconductor wafer's edge-center temperature difference to limit physical stress on the semiconductor wafer; and
   a plant, wherein the at least one controller is coupled between the limiter and the plant.

2. The system of claim 1 wherein the limiter provides the limiter value to the controller for limiting the stress in the plant during a ramping cycle of the variable under control.

3. The system of claim 1 wherein the limiter comprises a mechanism for comparing a difference between a requested value and a previous output of the limiter to an allowable limit of the variable under control and outputting a new limiter value to the controller.

4. The system of claim 3 wherein the mechanism for comparing a difference between a requested value and a previous output of the limiter to an allowable limit of the variable under control and outputting a new limiter value to the controller comprises hardware.

5. The system of claim 3 wherein the mechanism for comparing a difference between a requested value and a previous output of the limiter to an allowable limit of the variable under control and outputting a new limiter value to the controller comprises software.

6. The system of claim 1 wherein the plant is a semiconductor furnace.

7. The system of claim 6 wherein the variable under control is temperature.

8. The system of claim 1, wherein the semiconductor wafer's edge-center temperature difference is computed from an actual ramp rate value of the semiconductor wafer and a scale factor of the semiconductor wafer.

9. The system of claim 8, wherein the semiconductor wafer's edge-center temperature difference as a function of a furnace temperature is provided to the limiter with the scale factor to generate a limit curve.

10. The system of claim 9, wherein the limiter determines if a desired wafer temperature value would exceed the limit curve.

11. The system of claim 10, wherein the limiter adjusts the desired temperature value when the limit curve is exceeded so that the semiconductor wafer's edge-center temperature difference creates less physical stress on the semiconductor wafer than if the desired temperature value were used.

12. A system to adjust a variable-dependent ramp rate of a variable under control in a system under control, the system comprising:
    a limiter;
    at least one controller; and
    a plant, wherein the at least one controller is coupled between the limiter and the plant;
    wherein the limiter
    a) determines an allowable limit of the variable under control by evaluating a maximum allowable ramp rate limit curve at a previous output of a limiter;
    b) compares the allowable limit of the variable under control to a difference between a user requested value of the variable under control and the previous output of the limiter; and
    c) sets a new output of the limiter based upon a result of the comparison in step b).

13. The system of claim 12, wherein the limiter further:
    enters a user-provided limit curve of the variable under control; and
    obtains a scale factor curve from a model of the system under control' and producing a maximum allowable ramp rate limit curve.

14. The system of claim 12 wherein in step c), the limiter further determines if a difference between a requested value and a previous output of a limiter is less than the allowable limit of the variable under control, wherein if the difference between the requested value and the previous output of the limiter is less than the allowable limit of the variable under control, then setting a new output of the limiter equal to the requested value, and if the difference between the requested value and the previous output of the limiter is not less than the allowable limit of the variable under control, then setting the new output of the limiter equal to the previous output of the limiter plus the allowable limit of the variable under control.

15. The system of claim 12 wherein the limiter repeats steps a)–c) on an ongoing basis during the operation of the system under control.

16. The system of claim 13 wherein a the limiter interpolates the limit curve from several values of (Temp, .DELTA.T).

17. The system of claim 13 wherein the limiter combines the limit curve and the scale factor curve to obtain the maximum allowable ramp rate limit curve.

18. A system to adjust a variable-dependent ramp rate of a variable under control in a system under control, the system comprising:
   a limiter;
   at least one controller; and
   a plant, wherein the at least one controller is coupled between the limiter and the plant;
   wherein the limiter
      a) receives a user-provided limit curve of the variable under control;
      b) obtains a scale factor curve from a model of the system under control' and
      c) produces a maximum allowable ramp rate limit curve,
      d) determines an allowable limit of the variable under control by evaluating the maximum allowable ramp rate limit curve at a previous output of a limiter;
      e) compares the allowable limit of the variable under control to a difference between a user requested value of the variable under control and the previous output of the limiter; and
      f) sets a new output of the limiter based upon a result of the comparison in step e).

19. The system of claim 18 wherein the limiter further determines
   if a difference between a requested value and a previous output of a limiter is less than the allowable limit of the variable under control, wherein if the difference between the requested value and the previous output of the limiter is less than the allowable limit of the variable under control, then setting a new output of the limiter equal to the requested value, and if the difference between the requested value and the previous output of the limiter is not less than the allowable limit of the variable under control, then setting the new output of the limiter equal to the previous output of the limiter plus the allowable limit of the variable under control.

20. The system of claim 18 wherein steps d)–f) are repeated on an ongoing basis during the operation of the system under control.

21. The system of claim 18 wherein a the limiter interpolates the limit curve from several values of (Temp, .DELTA.T).

22. The system of claim 18 wherein the limiter combines the limit curve and the scale factor curve to obtain the maximum allowable ramp rate limit curve.

* * * * *